US010444582B1

(12) United States Patent
Zhu et al.

(10) Patent No.: US 10,444,582 B1
(45) Date of Patent: Oct. 15, 2019

(54) METHOD FOR MANUFACTURING ARRAY SUBSTRATE

(71) Applicant: Shenzhen China Star Optoelectronics Semiconductor Display Technology Co., Ltd., Shenzhen, Guangdong (CN)

(72) Inventors: Maoxia Zhu, Guangdong (CN); Hongyuan Xu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/072,183

(22) PCT Filed: Apr. 27, 2018

(86) PCT No.: PCT/CN2018/084720
§ 371 (c)(1),
(2) Date: Jul. 24, 2018

(30) Foreign Application Priority Data

Mar. 30, 2018 (CN) .......................... 2018 1 0293048

(51) Int. Cl.
G02F 1/1368 (2006.01)
G02F 1/1362 (2006.01)
H01L 27/12 (2006.01)
G02F 1/1343 (2006.01)
H01L 21/311 (2006.01)

(52) U.S. Cl.
CPC ...... *G02F 1/136227* (2013.01); *G02F 1/1343* (2013.01); *G02F 1/1368* (2013.01); *H01L 27/1288* (2013.01); *G02F 2001/136236* (2013.01); *G02F 2201/123* (2013.01); *H01L 21/31116* (2013.01)

(58) Field of Classification Search
CPC ............ G02F 1/136227; G02F 1/1343; G02F 1/1368; G02F 2201/123; G02F 2001/136236; H01L 27/1288; H01L 21/31116
See application file for complete search history.

(56) References Cited

U.S. PATENT DOCUMENTS

2010/0220254 A1* 9/2010 Liu .................... H01L 33/08
349/46

* cited by examiner

*Primary Examiner* — Kyoung Lee
(74) *Attorney, Agent, or Firm* — Mark M. Friedman

(57) ABSTRACT

The present disclosure provides a method for manufacturing an array substrate. An ashing treatment is performed on the first photoresist pattern to remove the photoresist layer in the photoresist-partially-retained-region and to thin the photoresist layer in the photoresist-entirely-retained-region, so that a second photoresist pattern is generated. Thereafter, the passivation layer is etched using the second photoresist pattern as a mask to thin the passivation layer in the photoresist-partially-retained-region and to reduce roughness of the rough top surface in the photoresist-partially-retained-region. Therefore, process stability is raised.

18 Claims, 7 Drawing Sheets

METHOD FOR MANUFACTURING ARRAY SUBSTRATE

FIELD OF INVENTION

The present disclosure relates to the field of display technology, and more particularly to a method for manufacturing an array substrate.

BACKGROUND

Display technology has developed rapidly in recent years. Liquid crystal displays (LCDs) have become part of human being's life. Typically, an LCD includes an array substrate, a counter substrate, and a liquid crystal layer sandwiched between the two substrates. The array substrate has a thin film transistor (TFT) formed thereon. Liquid crystal molecules in the liquid crystal layer are driven and controlled by an electric field, which is generated between a pixel electrode connected to TFT and a common electrode, so that display of images is realized.

Conventionally, a three-mask process is used to manufacture the array substrate. The process includes forming a rough surface on top of photoresist layer. Because of roughness of top surface of photoresist layer, pixel electrode formed on photoresist layer later could be broken to have stripping solution contact photoresist layer during stripping treatment. Formation of rough surface on top of photoresist layer increases stripping efficiency. However, while rough surface is formed on top of photoresist layer, rough surface is also formed on top of passivation layer. Roughness of rough surface generated on top of passivation layer cannot be reduced using water, stripping solution, or air gun, and thus influences process stability and display quality.

SUMMARY OF DISCLOSURE

The present disclosure provides a method for manufacturing an array substrate, where the method raises process stability.

In a first aspect, the present disclosure provides a method for manufacturing an array substrate, including:

forming a passivation layer on a substrate;

forming a photoresist layer on the passivation layer, and performing an exposure and developing process to form a first photoresist pattern having a photoresist-entirely-retained-region, a photoresist-partially-retained-region, and a photoresist-entirely-removed-region;

etching the passivation layer using the first photoresist pattern as a mask to form a first through-hole in the passivation layer;

performing an ashing treatment on the first photoresist pattern to remove the photoresist layer in the photoresist-partially-retained-region and to thin the photoresist layer in the photoresist-entirely-retained-region, such that a second photoresist pattern is generated, wherein both of the photoresist-partially-retained-region and the photoresist-entirely-retained-region have a rough top surface; and etching the passivation layer using the second photoresist pattern as a mask to thin the passivation layer in the photoresist-partially-retained-region and to reduce roughness of the rough top surface in the photoresist-partially-retained-region;

wherein the photoresist-entirely-removed-region of the first photoresist pattern correspond to a region of the passivation layer where the first through-hole is formed, the photoresist-partially-retained-region of the first photoresist pattern correspond to a to-be-thinned region of the passivation layer, and the rough top surface includes a plurality of protruding peaks spaced apart from each other.

In the method for manufacturing the array substrate according to the present disclosure, after etching the passivation layer using the second photoresist pattern as the mask to thin the passivation layer in the photoresist-partially-retained-region and to reduce roughness of the rough top surface in the photoresist-entirely-retained-region, the method includes:

depositing a pixel electrode on the substrate including the passivation layer and the photoresist layer; and removing the photoresist layer using a stripping solution, such that a pixel electrode pattern is formed.

In the method for manufacturing the array substrate according to the present disclosure, after etching the passivation layer using the second photoresist pattern as the mask to thin the passivation layer in the photoresist-partially-retained-region and to reduce roughness of the rough top surface in the photoresist-entirely-retained-region, and before depositing the pixel electrode on the substrate including the passivation layer and the photoresist layer, the method includes:

performing an ashing treatment on the second photoresist pattern to increase roughness of the rough top surface in the photoresist-entirely-retained-region after the passivation layer is thinned.

In the method for manufacturing the array substrate according to the present disclosure, the ashing treatment is an oxygen plasma ashing treatment.

In the method for manufacturing the array substrate according to the present disclosure, before forming the passivation layer on the substrate, the method further includes:

forming a thin film transistor (TFT) pattern on the substrate.

In the method for manufacturing the array substrate according to the present disclosure, a gray tone mask or a half tone mask is used as the mask for performing the exposure and developing process to form the first photoresist pattern having the photoresist-entirely-retained-region, the photoresist-partially-retained-region, and the photoresist-entirely-removed-region.

In the method for manufacturing the array substrate according to the present disclosure, a full transparent region of the gray tone mask or the half tone mask corresponds to the photoresist-entirely-removed-region of the first photoresist pattern, a semi-transparent region of the gray tone mask or the half tone mask corresponds to the photoresist-partially-retained-region of the first photoresist pattern, and an opaque region of the gray tone mask or the half tone mask corresponds to the photoresist-entirely-retained-region of the first photoresist pattern.

In the method for manufacturing the array substrate according to the present disclosure, the etching is a dry etching.

In a second aspect, the present disclosure provides a method for manufacturing an array substrate, including:

forming a passivation layer on a substrate;

forming a photoresist layer on the passivation layer, and performing an exposure and developing process to form a first photoresist pattern having a photoresist-entirely-retained-region, a photoresist-partially-retained-region, and a photoresist-entirely-removed-region;

etching the passivation layer using the first photoresist pattern as a mask to form a first through-hole in the passivation layer;

performing an ashing treatment on the first photoresist pattern to remove the photoresist layer in the photoresist-partially-retained-region and to thin the photoresist layer in the photoresist-entirely-retained-region, such that a second photoresist pattern is generated, wherein both of the photoresist-partially-retained-region and the photoresist-entirely-retained-region have a rough top surface; and etching the passivation layer using the second photoresist pattern as a mask to thin the passivation layer in the photoresist-partially-retained-region and to reduce roughness of the rough top surface in the photoresist-partially-retained-region.

In the method for manufacturing the array substrate according to the present disclosure, after etching the passivation layer using the second photoresist pattern as the mask to thin the passivation layer in the photoresist-partially-retained-region and to reduce roughness of the rough top surface in the photoresist-entirely-retained-region, the method includes:

depositing a pixel electrode on the substrate including the passivation layer and the photoresist layer; and removing the photoresist layer using a stripping solution, such that a pixel electrode pattern is formed.

In the method for manufacturing the array substrate according to the present disclosure, after etching the passivation layer using the second photoresist pattern as the mask to thin the passivation layer in the photoresist-partially-retained-region and to reduce roughness of the rough top surface in the photoresist-entirely-retained-region, and before depositing the pixel electrode on the substrate including the passivation layer and the photoresist layer, the method includes:

performing an ashing treatment on the second photoresist pattern to increase roughness of the rough top surface in the photoresist-entirely-retained-region after the passivation layer is thinned.

In the method for manufacturing the array substrate according to the present disclosure, the ashing treatment is an oxygen plasma ashing treatment.

In the method for manufacturing the array substrate according to the present disclosure, before forming the passivation layer on the substrate, the method further includes:

forming a thin film transistor (TFT) pattern on the substrate.

In the method for manufacturing the array substrate according to the present disclosure, a gray tone mask or a half tone mask is used as the mask for performing the exposure and developing process to form the first photoresist pattern having the photoresist-entirely-retained-region, the photoresist-partially-retained-region, and the photoresist-entirely-removed-region.

In the method for manufacturing the array substrate according to the present disclosure, a full transparent region of the gray tone mask or the half tone mask corresponds to the photoresist-entirely-removed-region of the first photoresist pattern, a semi-transparent region of the gray tone mask or the half tone mask corresponds to the photoresist-partially-retained-region of the first photoresist pattern, and an opaque region of the gray tone mask or the half tone mask corresponds to the photoresist-entirely-retained-region of the first photoresist pattern.

In the method for manufacturing the array substrate according to the present disclosure, the photoresist-entirely-removed-region of the first photoresist pattern correspond to a region of the passivation layer where the first through-hole is formed, and the photoresist-partially-retained-region of the first photoresist pattern correspond to a to-be-thinned region of the passivation layer.

In the method for manufacturing the array substrate according to the present disclosure, the rough top surface includes a plurality of protruding peaks spaced apart from each other In the method for manufacturing the array substrate according to the present disclosure, the etching is a dry etching.

The present disclosure provides a method for manufacturing an array substrate. According to the present disclosure, an ashing treatment is performed on the first photoresist pattern to remove the photoresist layer in the photoresist-partially-retained-region and to thin the photoresist layer in the photoresist-entirely-retained-region, so that a second photoresist pattern is generated, wherein both of the photoresist-partially-retained-region and the photoresist-entirely-retained-region have a rough top surface. Thereafter, the passivation layer is etched using the second photoresist pattern as a mask to thin the passivation layer in the photoresist-partially-retained-region and to reduce roughness of the rough top surface in the photoresist-partially-retained-region. Therefore, process stability is raised.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
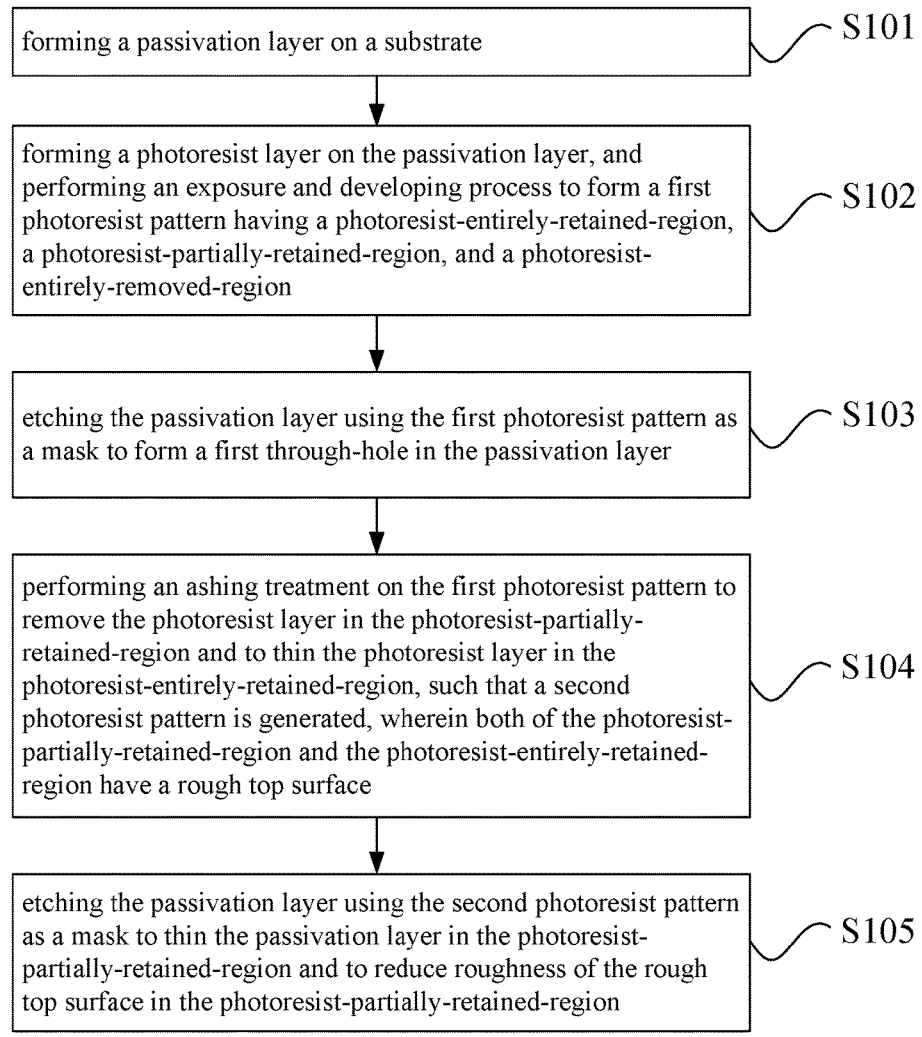
FIG. 1 shows a flow chart of a method for manufacturing an array substrate according to one embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Please refer to FIG. 1, which shows a flow chart of a method for manufacturing an array substrate according to one embodiment of the present disclosure. As shown in FIG. 1, the method for manufacturing the array substrate according to one embodiment of the present disclosure includes:

a step S101 of forming a passivation layer on a substrate;

a step S102 of forming a photoresist layer on the passivation layer, and performing an exposure and developing process to form a first photoresist pattern having a photoresist-entirely-retained-region, a photoresist-partially-retained-region, and a photoresist-entirely-removed-region;

a step S103 of etching the passivation layer using the first photoresist pattern as a mask to form a first through-hole in the passivation layer;

a step S104 of performing an ashing treatment on the first photoresist pattern to remove the photoresist layer in the photoresist-partially-retained-region and to thin the photoresist layer in the photoresist-entirely-retained-region, such that a second photoresist pattern is generated, wherein both of the photoresist-partially-retained-region and the photoresist-entirely-retained-region have a rough top surface; and a step S105 of etching the passivation layer using the second photoresist pattern as a mask to thin the passivation layer in the photoresist-partially-retained-region and to reduce roughness of the rough top surface in the photoresist-partially-retained-region.

Figure 2A:
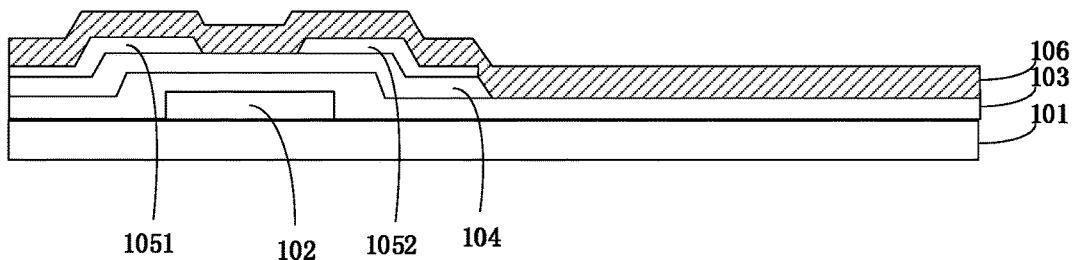
FIGS. 2A, 2B, 2C, 2D, 2E, 2F, 2G, 2H, and 2I show a process flow of a method for manufacturing an array substrate according to one embodiment of the present disclosure.

Specifically, in step S101 (as shown in FIG. 2A), a substrate 101 is provided, and a passivation layer 106 is formed on the substrate 101. For example, the substrate 101 could be a glass substrate, a silicon substrate, a resin substrate, or other substrate. The passivation layer 106 could be made of an inorganic insulating material (such as silicon nitride (SiNx), silicon oxide (SiOx), or silicon oxynitride (SiNxOy)) or an organic insulating material (such as polyimide). Preferably, the passivation layer 106 is formed on the substrate by evaporation, chemical vapor deposition, coating process, sol-gel process, or other technique.

Referring to FIG. 2A, before step S101, the method for manufacturing the array substrate according to one embodiment of the present disclosure further includes forming a thin film transistor (TFT) pattern on the substrate. Specifically, formation of TFT on the substrate includes: forming a gate electrode 102 on the substrate 101; forming a gate insulation layer 103 on the gate electrode 102; forming an active layer 104 on the gate insulation layer 103; forming a source electrode 1051 and a drain electrode 1052 on the active layer 104; and forming a passivation layer 106 on the source electrode 1051 and the drain electrode 1052.

Figure 2B:
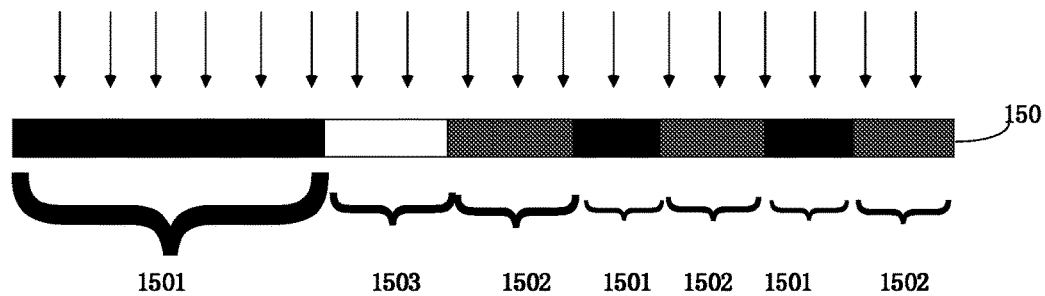
Figure 2B:
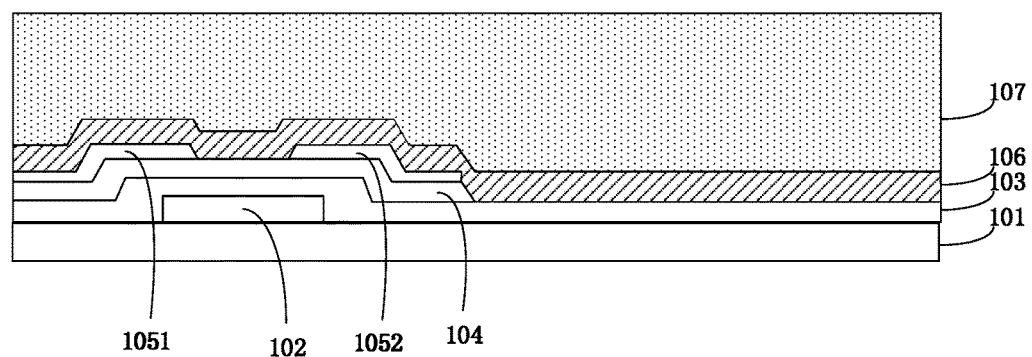
Figure 2C:
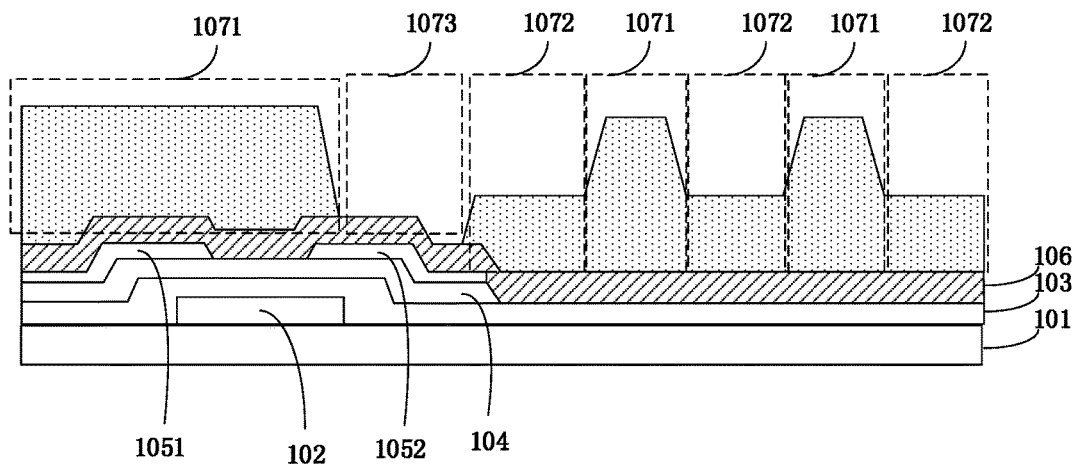

In step S102, as shown in FIGS. 2B and 2C, a photoresist layer 107 is formed on the passivation layer 106, and an exposure and developing process is performed to form a first photoresist pattern having a photoresist-entirely-retained-region 1071, a photoresist-partially-retained-region 1072, and a photoresist-entirely-removed-region 1073.

For example, a photoresist layer 107 is formed on the passivation layer 106 first, and then a gray tone mask or a half tone mask 150 is used as a mask to perform an exposure and developing process for the photoresist layer 107, so that a first photoresist pattern having a photoresist-entirely-retained-region 1071, a photoresist-partially-retained-region 1072, and a photoresist-entirely-removed-region 1073 is formed.

Preferably, a full transparent region 1503 of the gray tone mask or the half tone mask 150 corresponds to the photoresist-entirely-removed-region 1073 of the first photoresist pattern, a semi-transparent region 1502 of the gray tone mask or the half tone mask 150 corresponds to the photoresist-partially-retained-region 1072 of the first photoresist pattern, and an opaque region 1501 of the gray tone mask or the half tone mask 150 corresponds to the photoresist-entirely-retained-region 1073 of the first photoresist pattern.

A positive-type photoresist is used herein as an example for illustration, but the photoresist layer of the present disclosure is not limited thereto.

Figure 2D:
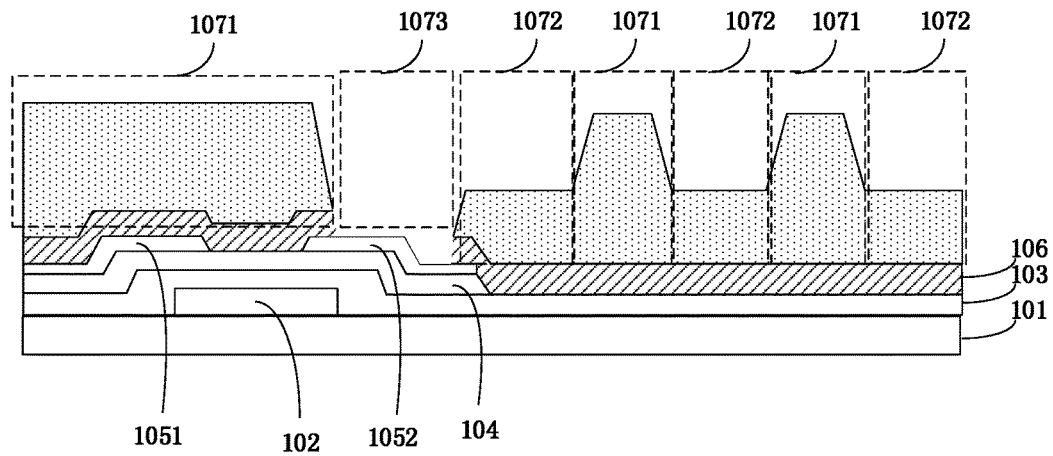

In step S103, as shown in FIG. 2D, the passivation layer 106 is etched using the first photoresist pattern as a mask to form a first through-hole in the passivation layer 106. This step makes the drain electrode 1052 at the first through-hole exposed. A pixel electrode formed later is electrically connected to the exposed drain electrode 1052.

Figure 2E:
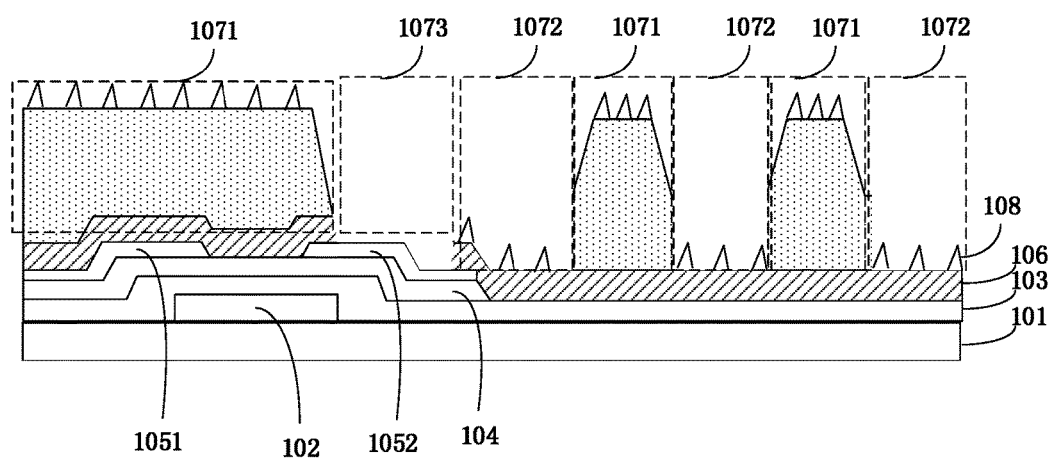

In step S104, as shown in FIG. 2E, an ashing treatment is performed on the first photoresist pattern to remove the photoresist layer 107 in the photoresist-partially-retained-region 1072 and to thin the photoresist layer 107 in the photoresist-entirely-retained-region 1071, such that a second photoresist pattern is generated, wherein both of the photoresist-partially-retained-region 1072 and the photoresist-entirely-retained-region 1071 have a rough top surface. Rough top surface, herein, means that roughness of the top surface of the photoresist layer 107 is so large that the rough top surface includes a plurality of protruding peaks (or protrusions) spaced apart from each other.

Figure 2F:
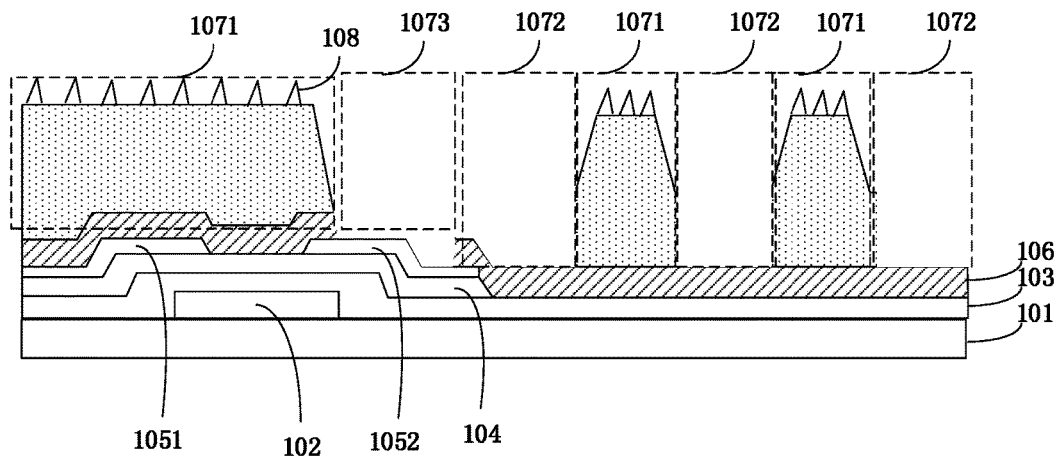

In step S105, as shown in FIG. 2F, the passivation layer 106 is etched using the second photoresist pattern as a mask to thin the passivation layer 106 in the photoresist-partially-retained-region 1072 and to reduce roughness of the rough top surface in the photoresist-partially-retained-region 1072. It is understood that, the rough top surface generated in the photoresist-partially-retained-region 1072 directly contacts the passivation layer 106, and cannot be reduced using water, stripping solution, or air gun. However, according to the present disclosure, by thinning the photoresist-partially-retained-region 1072, roughness of the rough top surface generated in the photoresist-partially-retained-region 1072 is reduced. This prevents the rough top surface generated in the photoresist-partially-retained-region 1072 from influencing subsequent processes, thus process stability is raised. After step S105 is performed, the rough top surface generated in the photoresist-entirely-retained-region 1071 still exists.

In the present embodiment, the photoresist-entirely-removed-region 1073 of the first photoresist pattern correspond to a region of the passivation layer 106 where the first through-hole is formed, and the photoresist-partially-retained-region 1072 of the first photoresist pattern correspond to a to-be-thinned region of the passivation layer 106. Therefore, in the region of the passivation layer 106 corresponding to the photoresist-entirely-removed-region 1073 of the first photoresist pattern, the first through-hole is formed by etching. Next, the photoresist layer 107 in the photoresist-partially-retained-region 1072 of the first photoresist pattern is removed by ashing. Then, the passivation layer 106 corresponding to the photoresist-partially-retained-region 1072 of the first photoresist layer is thinned by etching. It is understood that the etching is a dry etching, and the ashing treatment is an oxygen plasma ashing treatment. The etching technique and the ashing treatment of the present disclosure are not limited thereto.

Figure 3:
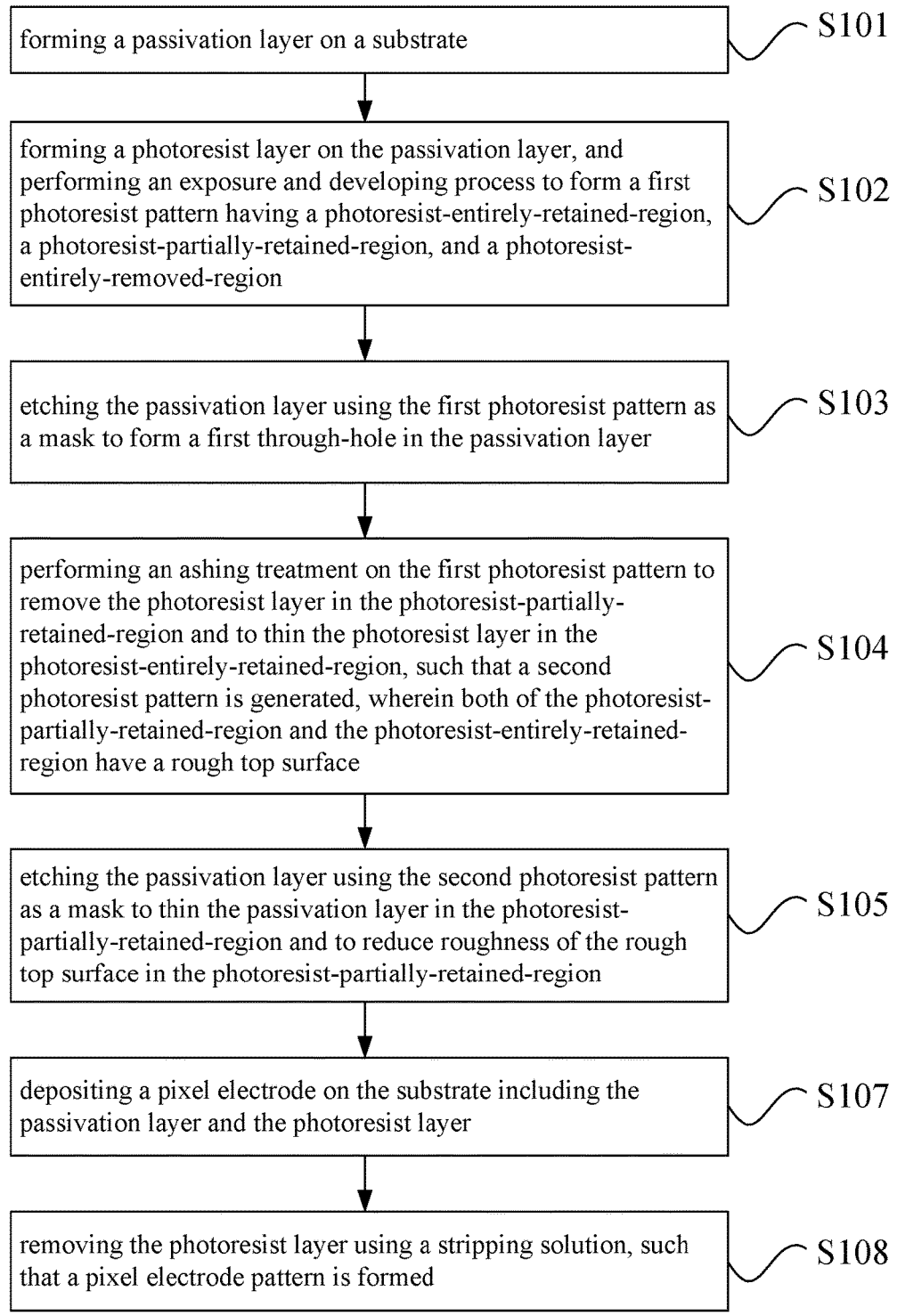
FIG. 3 shows another flow chart of a method for manufacturing an array substrate according to one embodiment of the present disclosure.

Moreover, please refer to FIG. 3, which shows another flow chart of a method for manufacturing an array substrate according to one embodiment of the present disclosure. As shown in FIG. 3, after step S105, the method for manufacturing the array substrate according to one embodiment of the present disclosure further includes a step S107 of depositing a pixel electrode on the substrate including the passivation layer and the photoresist layer.

Figure 2G:
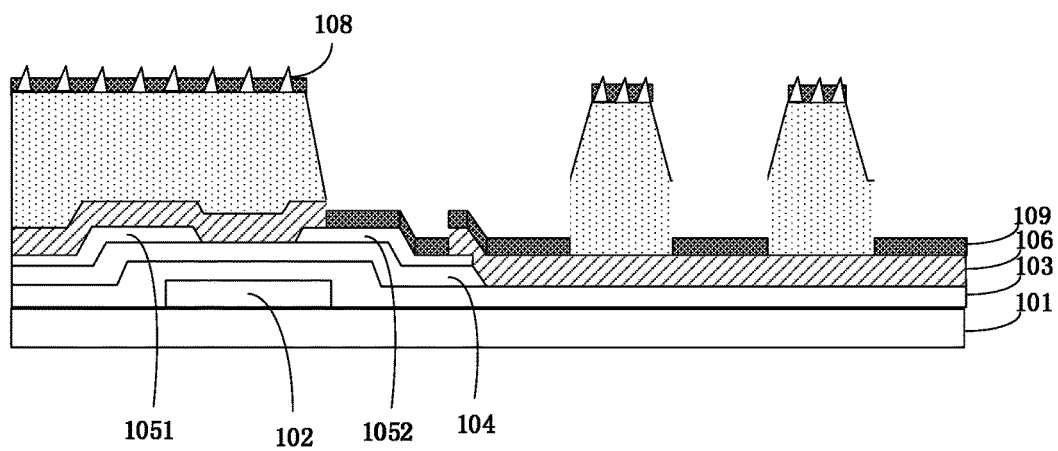

For example, as shown in FIG. 2G, a pixel electrode 109 is deposited on the substrate 101 including the passivation layer 106 and the photoresist layer 107.

Please further refer to FIG. 3. After step S107, the method for manufacturing the array substrate according to one embodiment of the present disclosure further includes a step S108 of removing the photoresist layer using a stripping solution, such that a pixel electrode pattern is formed.

Figure 2H:
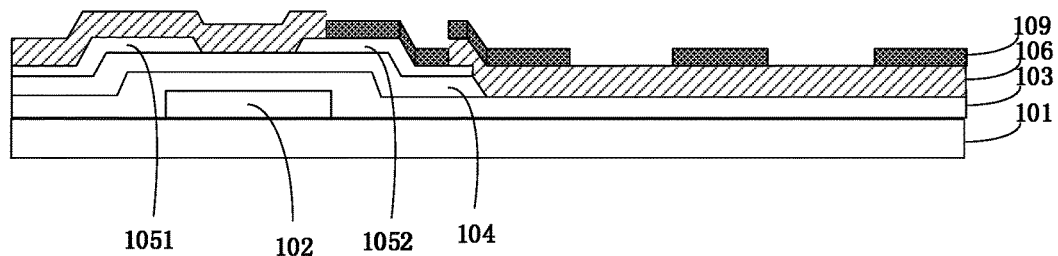

For example, as shown in FIG. 2H, the photoresist layer 107 is removed using a stripping solution, such that a pixel electrode pattern is formed. Because the photoresist layer has a rough top surface formed in the photoresist-entirely-retained-region 1071 and having a topography including protrusions/recesses, the pixel electrode 109 formed on the photoresist layer later could be broken to have the stripping solution contact the underneath photoresist layer 107 during stripping treatment. Formation of rough surface on top of the photoresist layer increases stripping efficiency.

Figure 4:
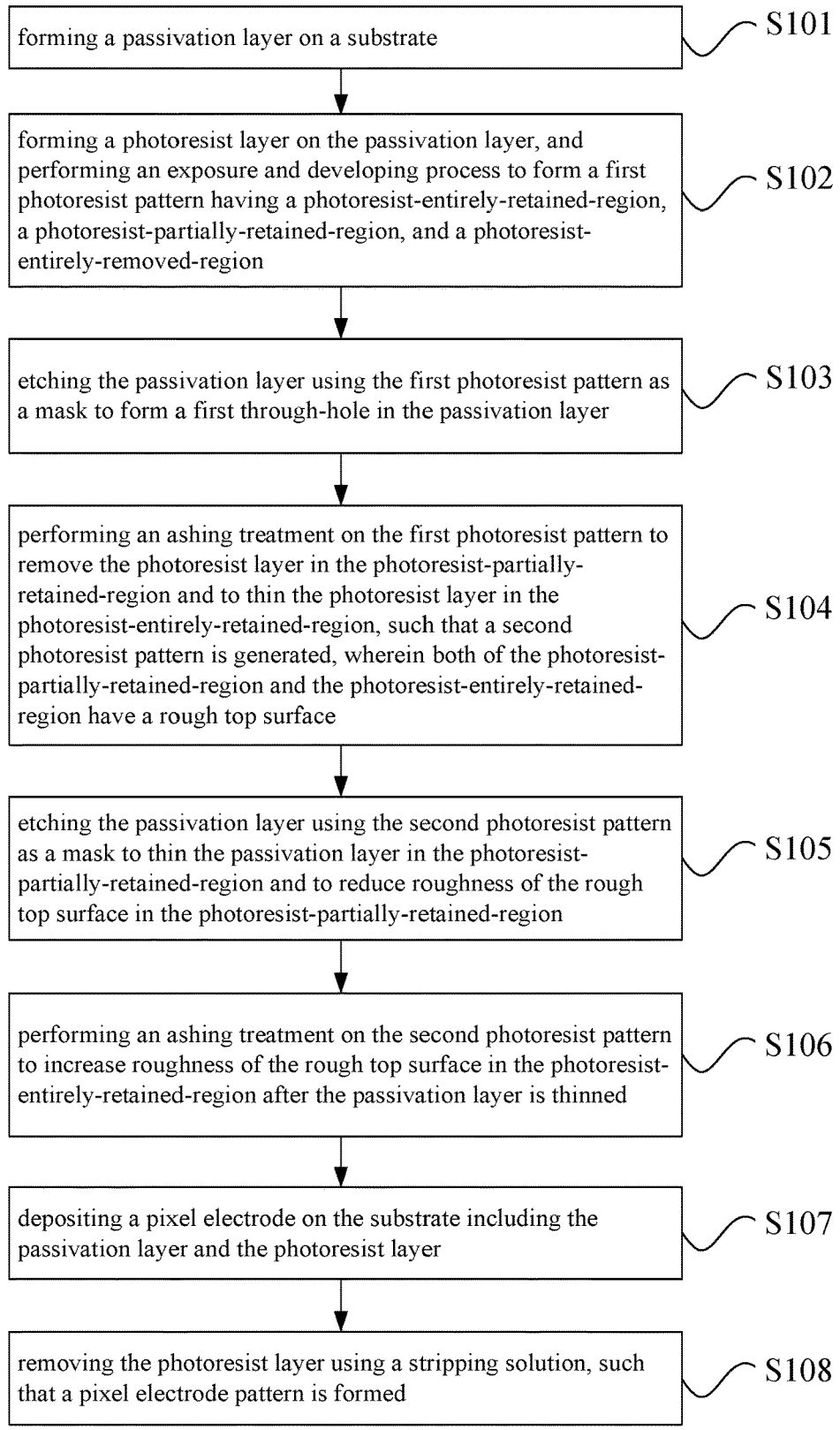
FIG. 4 shows yet another flow chart of a method for manufacturing an array substrate according to one embodiment of the present disclosure.

Furthermore, please refer to FIG. 4, which shows yet another flow chart of a method for manufacturing an array substrate according to one embodiment of the present disclosure. As shown in FIG. 4, after step S105 and before step S107, the method for manufacturing the array substrate according to one embodiment of the present disclosure further includes a step S106 of performing an ashing treatment on the second photoresist pattern to increase roughness of the rough top surface in the photoresist-entirely-retained-region after the passivation layer is thinned.

Figure 2I:
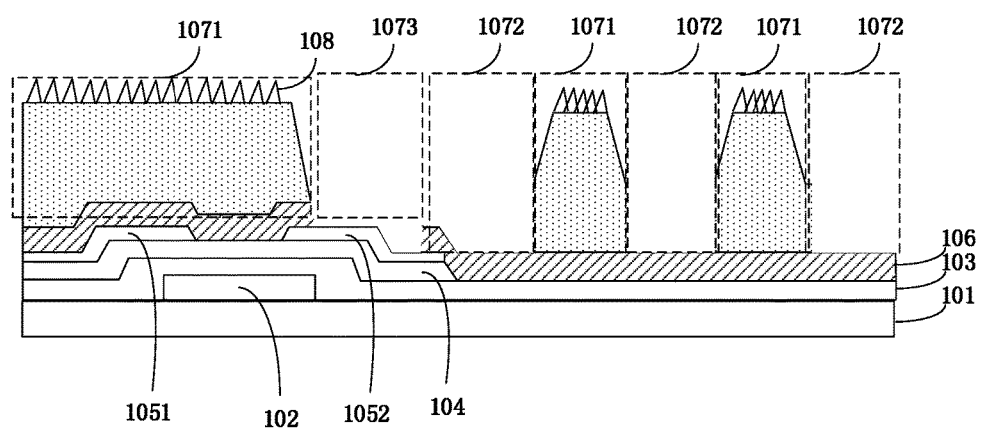

For example, as shown in FIG. 2I, an ashing treatment is performed on the second photoresist pattern to increase roughness of the rough top surface in the photoresist-entirely-retained-region 1071 after the passivation layer is thinned. Although an ashing treatment has been performed to generate a rough top surface in the photoresist-entirely-retained-region in step S104, roughness of the rough top surface in the photoresist-partially-retained-region is reduced by etching in step S105, and thus roughness of the rough top surface in the photoresist-entirely-retained-region would be decreased. According to the present disclosure, with an ashing treatment performed on the second photoresist pattern, roughness of the rough top surface in the photoresist-entirely-retained-region can be increased after the passivation layer is thinned. The ashing treatment is an oxygen plasma ashing treatment, but the ashing treatment of the present disclosure is not limited thereto.

The present disclosure provides a method for manufacturing an array substrate. According to the present disclosure, an ashing treatment is performed first on the first photoresist pattern to remove the photoresist layer in the photoresist-partially-retained-region and to thin the photoresist layer in the photoresist-entirely-retained-region, so that a second photoresist pattern is generated, wherein both of the photoresist-partially-retained-region and the photoresist-entirely-retained-region have a rough top surface. Then, the passivation layer is etched using the second photoresist pattern as a mask to thin the passivation layer in the photoresist-partially-retained-region and to reduce roughness of the rough top surface in the photoresist-partially-retained-region. Therefore, process stability is raised.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing an array substrate, comprising:
    forming a passivation layer on a substrate;
    forming a photoresist layer on the passivation layer, and performing an exposure and developing process to form a first photoresist pattern having a photoresist-entirely-retained-region, a photoresist-partially-retained-region, and a photoresist-entirely-removed-region;
    etching the passivation layer using the first photoresist pattern as a mask to form a first through-hole in the passivation layer;
    performing an ashing treatment on the first photoresist pattern to remove the photoresist layer in the photoresist-partially-retained-region and to thin the photoresist layer in the photoresist-entirely-retained-region, such that a second photoresist pattern is generated, wherein both of the photoresist-partially-retained-region and the photoresist-entirely-retained-region have a rough top surface; and
    etching the passivation layer using the second photoresist pattern as a mask to thin the passivation layer in the photoresist-partially-retained-region and to reduce roughness of the rough top surface in the photoresist-partially-retained-region;
    wherein the photoresist-entirely-removed-region of the first photoresist pattern correspond to a region of the passivation layer where the first through-hole is formed, the photoresist-partially-retained-region of the first photoresist pattern correspond to a to-be-thinned region of the passivation layer, and the rough top surface includes a plurality of protruding peaks spaced apart from each other.

2. The method for manufacturing the array substrate according to claim 1, wherein after etching the passivation layer using the second photoresist pattern as the mask to thin the passivation layer in the photoresist-partially-retained-region and to reduce roughness of the rough top surface in the photoresist-entirely-retained-region, the method includes:
    depositing a pixel electrode on the substrate including the passivation layer and the photoresist layer; and
    removing the photoresist layer using a stripping solution, such that a pixel electrode pattern is formed.

3. The method for manufacturing the array substrate according to claim 2, wherein after etching the passivation layer using the second photoresist pattern as the mask to thin the passivation layer in the photoresist-partially-retained-region and to reduce roughness of the rough top surface in the photoresist-entirely-retained-region, and before depositing the pixel electrode on the substrate including the passivation layer and the photoresist layer, the method includes:
    performing an ashing treatment on the second photoresist pattern to increase roughness of the rough top surface in the photoresist-entirely-retained-region after the passivation layer is thinned.

4. The method for manufacturing the array substrate according to claim 3, wherein the ashing treatment is an oxygen plasma ashing treatment.

5. The method for manufacturing the array substrate according to claim 1, wherein before forming the passivation layer on the substrate, the method further includes:
    forming a thin film transistor (TFT) pattern on the substrate.

6. The method for manufacturing the array substrate according to claim 1, wherein a gray tone mask or a half tone mask is used as the mask for performing the exposure and developing process to form the first photoresist pattern having the photoresist-entirely-retained-region, the photoresist-partially-retained-region, and the photoresist-entirely-removed-region.

7. The method for manufacturing the array substrate according to claim 6, wherein a full transparent region of the gray tone mask or the half tone mask corresponds to the photoresist-entirely-removed-region of the first photoresist pattern, a semi-transparent region of the gray tone mask or the half tone mask corresponds to the photoresist-partially-retained-region of the first photoresist pattern, and an opaque region of the gray tone mask or the half tone mask corresponds to the photoresist-entirely-retained-region of the first photoresist pattern.

8. The method for manufacturing the array substrate according to claim 1, wherein the etching is a dry etching.

9. A method for manufacturing an array substrate, comprising:
  forming a passivation layer on a substrate;
  forming a photoresist layer on the passivation layer, and performing an exposure and developing process to form a first photoresist pattern having a photoresist-entirely-retained-region, a photoresist-partially-retained-region, and a photoresist-entirely-removed-region;
  etching the passivation layer using the first photoresist pattern as a mask to form a first through-hole in the passivation layer;
  performing an ashing treatment on the first photoresist pattern to remove the photoresist layer in the photoresist-partially-retained-region and to thin the photoresist layer in the photoresist-entirely-retained-region, such that a second photoresist pattern is generated, wherein both of the photoresist-partially-retained-region and the photoresist-entirely-retained-region have a rough top surface; and
  etching the passivation layer using the second photoresist pattern as a mask to thin the passivation layer in the photoresist-partially-retained-region and to reduce roughness of the rough top surface in the photoresist-partially-retained-region.

10. The method for manufacturing the array substrate according to claim 9, wherein after etching the passivation layer using the second photoresist pattern as the mask to thin the passivation layer in the photoresist-partially-retained-region and to reduce roughness of the rough top surface in the photoresist-entirely-retained-region, the method includes:
  depositing a pixel electrode on the substrate including the passivation layer and the photoresist layer; and
  removing the photoresist layer using a stripping solution, such that a pixel electrode pattern is formed.

11. The method for manufacturing the array substrate according to claim 10, wherein after etching the passivation layer using the second photoresist pattern as the mask to thin the passivation layer in the photoresist-partially-retained-region and to reduce roughness of the rough top surface in the photoresist-entirely-retained-region, and before depositing the pixel electrode on the substrate including the passivation layer and the photoresist layer, the method includes:
  performing an ashing treatment on the second photoresist pattern to increase roughness of the rough top surface in the photoresist-entirely-retained-region after the passivation layer is thinned.

12. The method for manufacturing the array substrate according to claim 11, wherein the ashing treatment is an oxygen plasma ashing treatment.

13. The method for manufacturing the array substrate according to claim 9, wherein before forming the passivation layer on the substrate, the method further includes:
  forming a thin film transistor (TFT) pattern on the substrate.

14. The method for manufacturing the array substrate according to claim 9, wherein a gray tone mask or a half tone mask is used as the mask for performing the exposure and developing process to form the first photoresist pattern having the photoresist-entirely-retained-region, the photoresist-partially-retained-region, and the photoresist-entirely-removed-region.

15. The method for manufacturing the array substrate according to claim 14, wherein a full transparent region of the gray tone mask or the half tone mask corresponds to the photoresist-entirely-removed-region of the first photoresist pattern, a semi-transparent region of the gray tone mask or the half tone mask corresponds to the photoresist-partially-retained-region of the first photoresist pattern, and an opaque region of the gray tone mask or the half tone mask corresponds to the photoresist-entirely-retained-region of the first photoresist pattern.

16. The method for manufacturing the array substrate according to claim 9, wherein the photoresist-entirely-removed-region of the first photoresist pattern correspond to a region of the passivation layer where the first through-hole is formed, and the photoresist-partially-retained-region of the first photoresist pattern correspond to a to-be-thinned region of the passivation layer.

17. The method for manufacturing the array substrate according to claim 9, wherein the rough top surface includes a plurality of protruding peaks spaced apart from each other.

18. The method for manufacturing the array substrate according to claim 9, wherein the etching is a dry etching.

* * * * *